(12) United States Patent
Van Dine et al.

(10) Patent No.: US 6,230,791 B1
(45) Date of Patent: May 15, 2001

(54) HEAT TRANSFER COLD PLATE ARRANGEMENT

(75) Inventors: Pieter Van Dine, Mystic, CT (US); Edgar S. Thaxton, Bradford, RI (US); James S. Smith, Old Lyme; Jeffrey Linkinhoker, Uncasville, both of CT (US)

(73) Assignee: Electric Boat Corporation, Groton, CT (US)

( * ) Notice: Subject to any disclaimer, the term of this patent is extended or adjusted under 35 U.S.C. 154(b) by 0 days.

(21) Appl. No.: 09/385,277

(22) Filed: Aug. 30, 1999

(51) Int. Cl.⁷ ........................................................ H05K 7/20
(52) U.S. Cl. .................. 165/80.4; 165/168; 361/699; 361/702
(58) Field of Search .................... 165/80.4, 170, 165/168; 361/699, 702

(56) References Cited

U.S. PATENT DOCUMENTS

| | | |
|---|---|---|
| 4,266,604 | 5/1981 | Sumikawa et al. . |
| 4,420,739 | 12/1983 | Herren . |
| 4,758,926 * | 7/1988 | Herrell et al. ........................ 361/385 |
| 4,939,624 * | 7/1990 | August et al. ........................ 361/424 |
| 4,989,070 | 1/1991 | Iversen et al. . |
| 5,005,640 * | 4/1991 | Lapinski et al. ..................... 165/170 |
| 5,014,904 * | 5/1991 | Morton ................................. 228/176 |
| 5,043,797 * | 8/1991 | Lopes ..................................... 357/82 |
| 5,099,311 * | 3/1992 | Bonde et al. ........................... 357/82 |
| 5,111,280 | 5/1992 | Iversen . |
| 5,453,911 | 9/1995 | Wolgemuth et al. . |
| 5,636,684 * | 6/1997 | Teytu et al. .......................... 165/80.4 |
| 5,973,261 | 10/1999 | Chevallet et al. . |
| 6,039,114 | 3/2000 | Becker et al. . |

FOREIGN PATENT DOCUMENTS

| | | |
|---|---|---|
| 0508717 | 7/1992 | (EP) . |
| 0858107 | 1/1998 | (EP) . |
| 0930815 | 1/1999 | (EP) . |
| WO97/25741 | 7/1997 | (WO) . |

OTHER PUBLICATIONS

European Search Report.
English language abstract of EP 930815.

\* cited by examiner

*Primary Examiner*—Allen Flanigan
(74) *Attorney, Agent, or Firm*—Baker Botts L.L.P.

(57) ABSTRACT

In the embodiments described in the specification a metal heat transfer cold plate has two sets of parallel coolant passages extending between opposite end surfaces and non-metallic headers made of electrically insulating material are attached to the opposite ends of the metal plate. One of the headers provides an inlet to one set of coolant passages and an outlet from the other set of coolant passages and the other header provides fluid communication between the two sets of coolant passages. The headers are affixed to the cold plate by adhesive or by a snap-in connection having a sealing gasket between each header and the cold plate and the assembled cold plate and headers are insulatively supported by mounting feet attached to the electrically insulating headers.

10 Claims, 6 Drawing Sheets

US 6,230,791 B1

HEAT TRANSFER COLD PLATE ARRANGEMENT

BACKGROUND OF THE INVENTION

This invention relates to heat transfer cold plates for removing heat from electrical components and the like.

The Iversen U.S. Pat. No. 5,111,280 shows a cooling arrangement for semiconductor devices consisting of a plurality of plates on which the semiconductor devices are mounted, each plate having flow paths for cooling fluid extending between opposite ends of the plate and having terminals for one of three legs of a three-phase electrical system. Coolant supply and discharge manifolds made of electrically insulating material, such as ceramic or plastic, are affixed to the ends of the plates to circulate cooling fluid through the passages in the plates and to the spaces between the plates, using dielectric coolants such as fluorocarbons to assure electrical insulation. The specification does not describe the attachment of the manifold to the metal plates.

The Iverson et al. U.S. Pat. No. 4,989,070 discloses a modular heat sink structure which includes a metal heat sink having semiconductor devices supported through insulating joints from adjacent surfaces of the heat sink and a coolant flow path extending beneath the insulated supports for the semiconductor devices from an inlet opening at one end of the plate to an outlet opening at the same end of the plate.

The Patent to Wolgemoth et al. U.S. Pat. No. 4,453,911 discloses a cold plate arrangement in which a cold plate made of plastic material has a coolant flow path extending from one end to the opposite end which directs coolant along the surfaces of power electronic components mounted on one side of the cold plate.

In the Sumikawa et al. U.S. Pat. No. 4,266,604, a heat exchanger such as a hot water radiator for an automobile consists of a plurality of metal tubes having metal plates mounted between tanks made of rust proof synthetic resin.

The mounting of heat transfer plates on which electrical or electronic components are affixed so as to not only isolate the heat transfer plates and/or components electrically but also to prevent stray electrical currents from traveling between the plates and the mounting presents a problem.

SUMMARY OF THE INVENTION

Accordingly it is an object of the present invention to provide a heat transfer cold plate arrangement which overcomes disadvantages of the prior art.

Another object to the invention is to provide a heat transfer cold plate arrangement having a simple and convenient construction.

These and other objects of the invention are attained by providing a heat transfer cold plate arrangement including a cold plate which is electrically isolated from its surroundings by nonmetallic electrically insulating headers disposed at opposite ends of the cold plate to direct coolant to flow in two directions through the cold plate from an inlet in one header to a return header and back to an outlet in the first header and in which the assembly is supported by one or more mounts attached to the insulating headers.

In one embodiment, the cold plate arrangement includes a metal plate having an array of parallel internal channels extending between opposite end surfaces and nonmetallic headers made of electrically insulating composite material attached to the opposite ends of the metal plate, one of the headers providing inlet and outlet fluid flow paths and the other header providing flow communication between the cold plate channels supplied by the inlet flow path and the channels connected to the outlet flow path. The headers may be sealingly attached to the ends of the metal plate by adhesive or by snap-in connections with compressed gasketing. Heat-generating components to be cooled are mounted on the metal plate, for example, by threaded holes in the surfaces of the plate. To provide electrical isolation from adjacent components, the assembly is supported by feet which are attached to the insulating headers.

BRIEF DESCRIPTION OF THE DRAWINGS

Further objects and advantages of the invention will be apparent from a reading of the following description in conjunction with the accompanying drawings in which.

DESCRIPTION OF PREFERRED EMBODIMENTS

Figure 1:
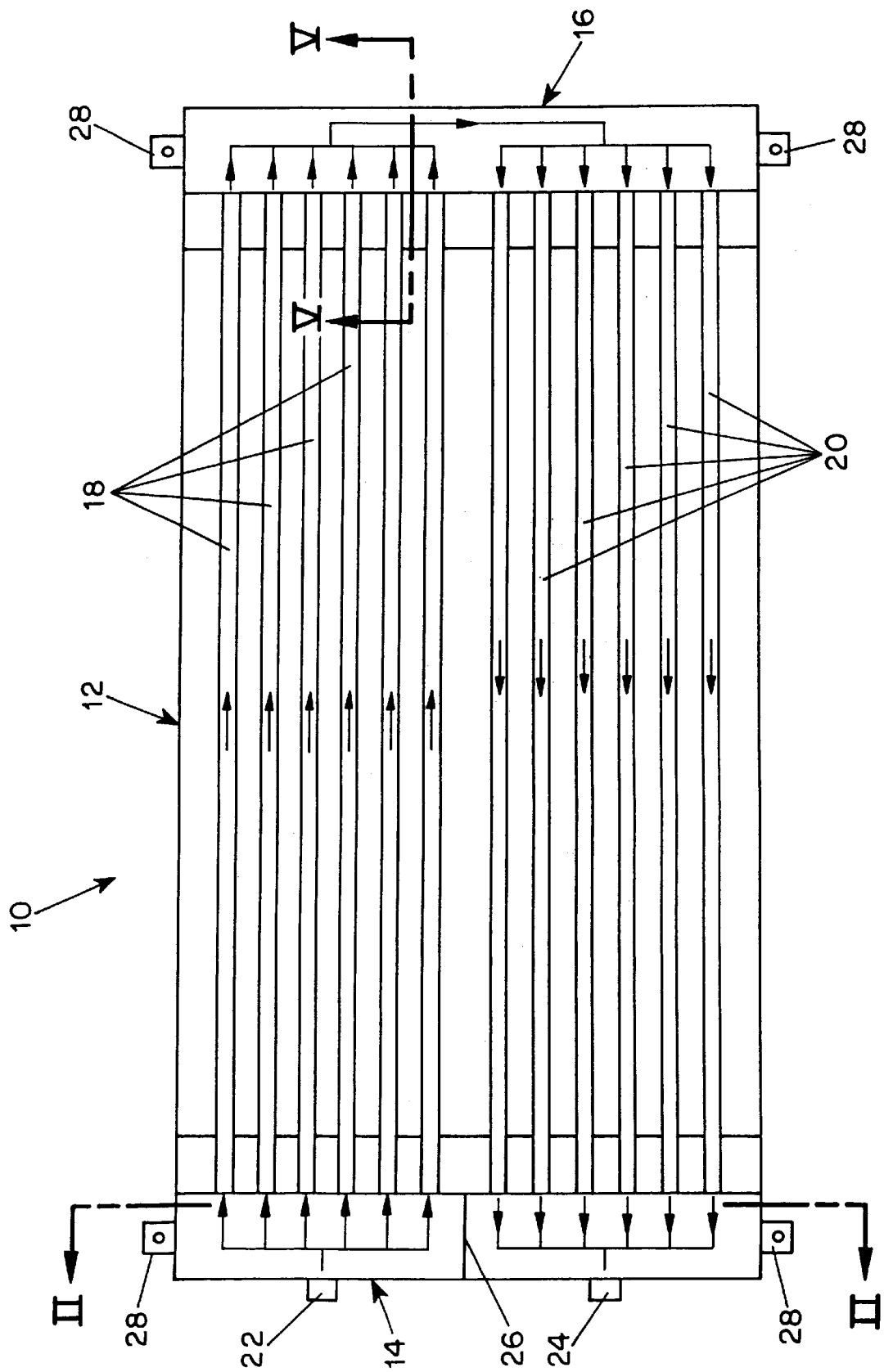
FIG. 1 is a schematic plan view illustrating a representative embodiment of a heat transfer cold plate arrangement in accordance with the invention.
Figure 2:
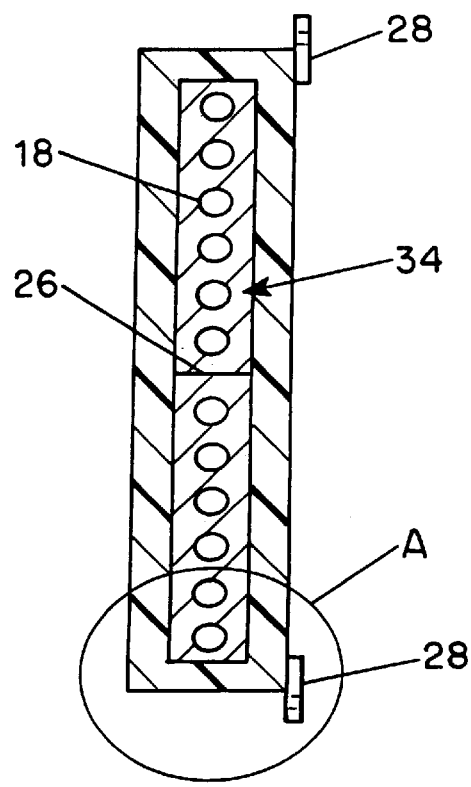
FIG. 2 is a cross-sectional view taken along the line II—II of FIG. 1 and looking in the direction of the arrows.
Figure 3:
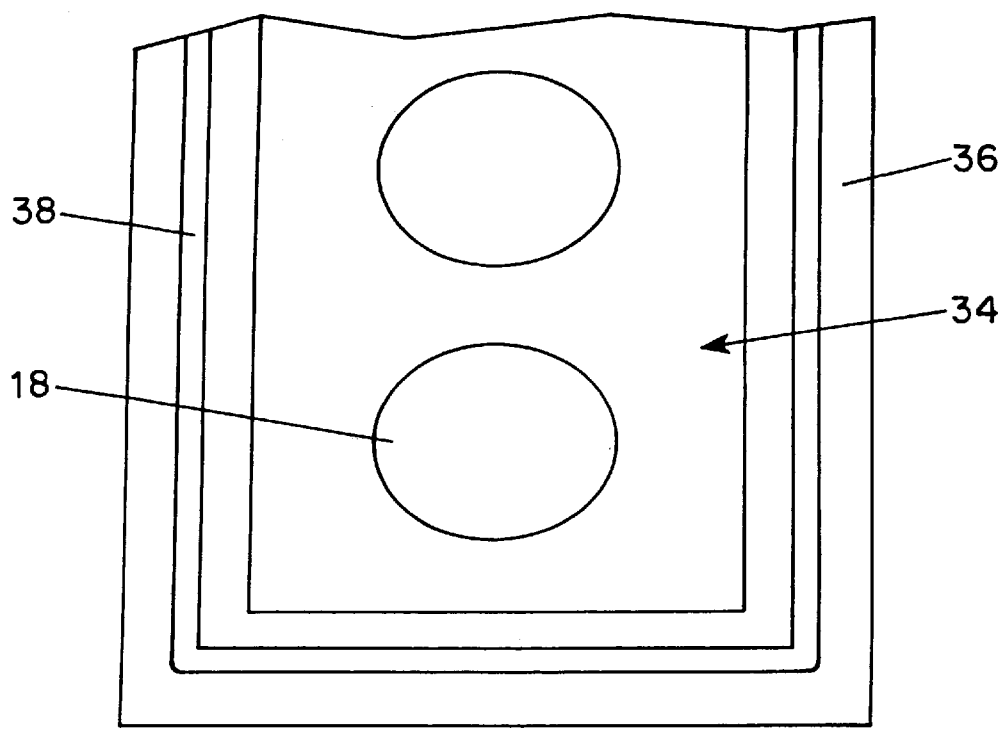
FIG. 3 is an enlarged fragmentary view of a portion of the cold plate designated A in the view shown in FIG. 2 with the header removed and looking in the opposite direction illustrating the gasket arrangement.
Figure 4:
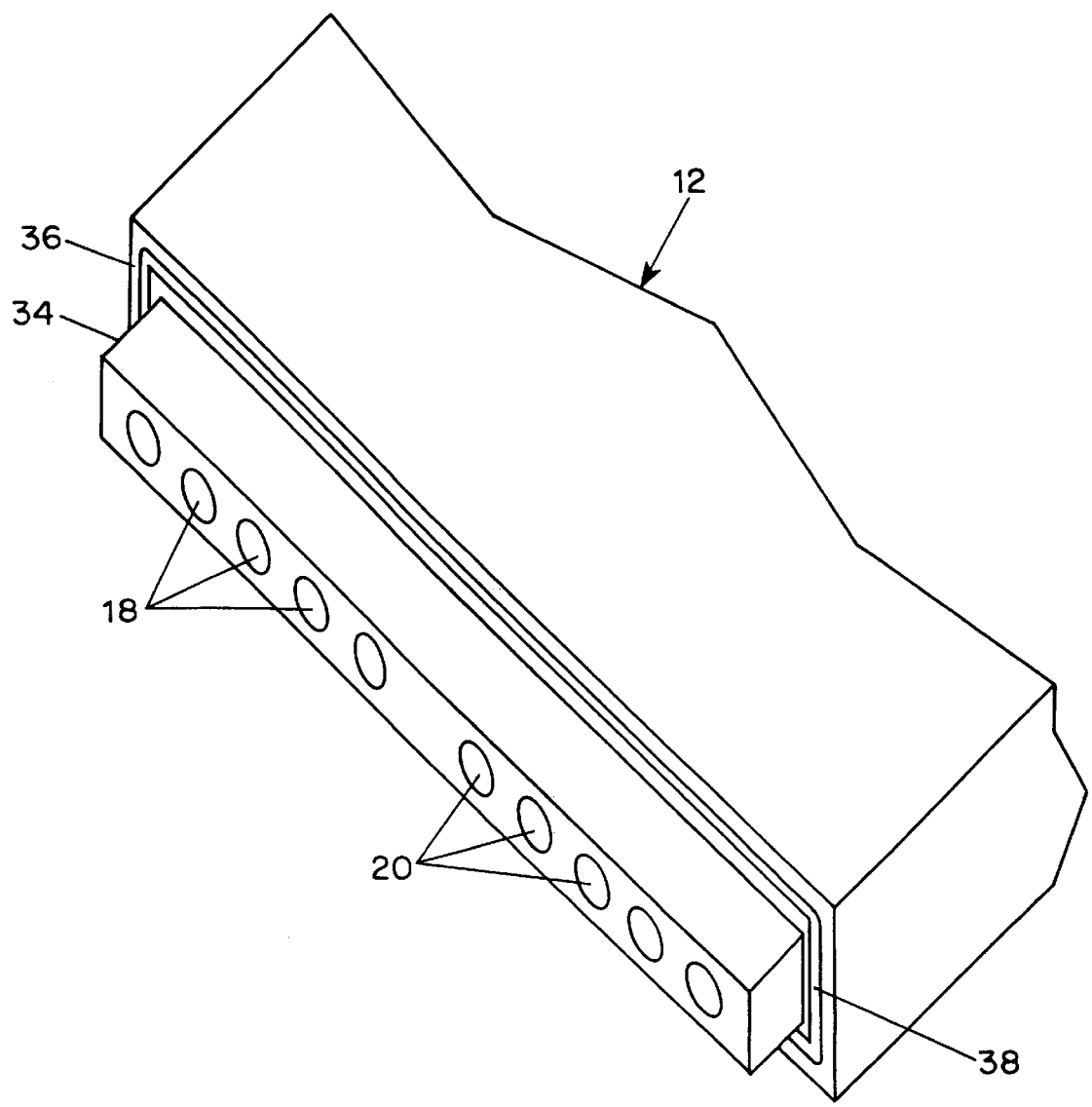
FIG. 4 is a fragmentary perspective view showing an end of the heat transfer cold plate of FIG. 1 with a header removed.

In the typical embodiment of the invention shown in FIGS. 1–4, a heat transfer cold plate arrangement 10 includes a metallic heat transfer cold plate 12, an electrically insulating inlet/outlet header 14 mounted at one end of the heat transfer cold plate and a return header 16 mounted at the other end of the heat transfer cold plate. In the illustrated arrangement, the heat transfer cold plate 12 has six linear intake fluid paths 18 and six linear return flow paths 20, each extending from one end of the cold plate to the other and all disposed essentially in the same plane located midway between the opposite sides of the heat transfer cold plate. It will be understood that the number and size of the flow passages 18 and 20 as well as the thickness of the cold plate 12 may be varied to suit the requirements of any particular application.

The inlet/outlet header 14 has an inlet nozzle 22, an outlet nozzle 24 and an internal partition 26 which separates the flow path through the header from the inlet nozzle 22 to the inlet passages 18 from the flow path through the header from the outlet passages 20 to the outlet nozzle 24 when the header is mounted in place at one end of the cold plate 12. The return header 16, mounted at the opposite end of the cold plate, has no internal partition, thereby permitting fluid from the inlet passages 18 to flow freely through it to the return passages 20.

The inlet/outlet header and the return header are preferably made of a composite material such as reinforced synthetic polymer resin material suitable for the application i.e., one capable of withstanding the fluid pressures and temperatures generated during the operation of the system. Most importantly, the material used in the headers should have no electrical conductivity and have a very low water absorption ability.

Each of the headers in the illustrated embodiment has two mounting feet 28 preferably disposed on the same side and at opposite ends of each header. The feet 28 may be made of metal or of a synthetic insulating material and should have a strength sufficient to permit the feet to support the entire cold plate arrangement and the electrical components mounted on it. Since the headers are made of electrically insulating material, the feet, which need not be electrically insulating, may be affixed to a metallic support structure without causing any electrical interference or short circuit difficulties.

Figure 5:
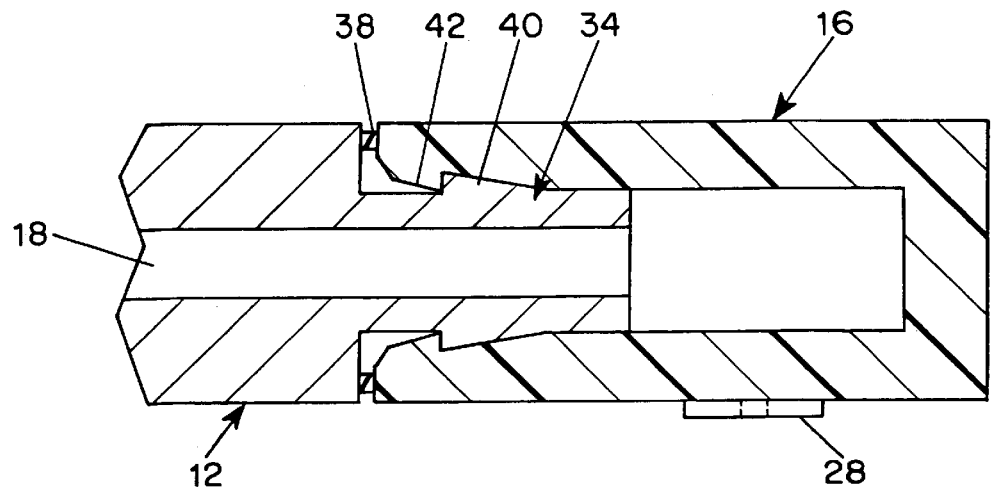
FIG. 5 is an enlarged fragmentary sectional view taken along the lines V—V of FIG. 1 and looking in the direction of the arrows, illustrating mounting of a header on a cold plate.
Figure 6:
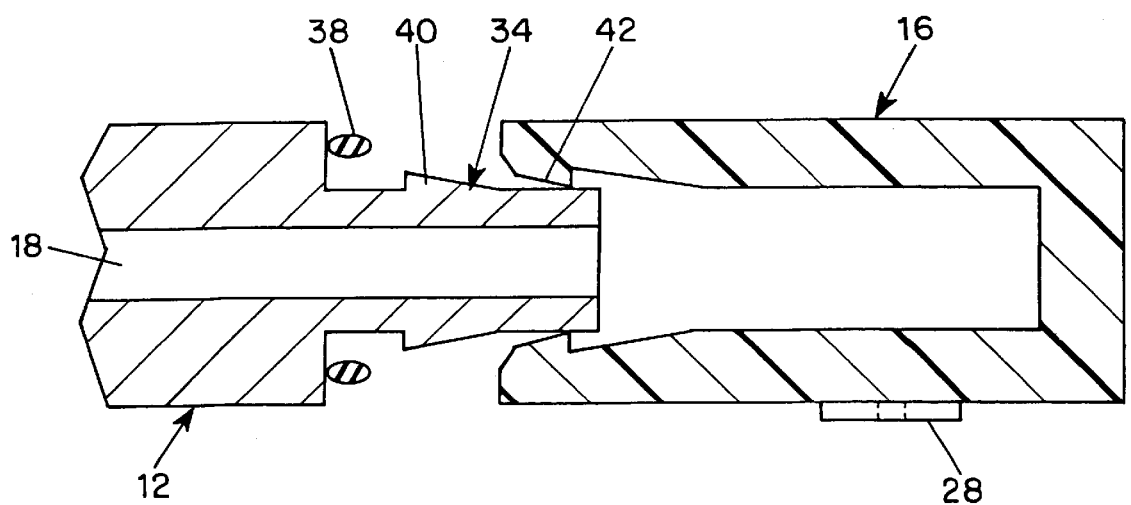
FIG. 6 is an enlarged fragmentary view similar to the FIG. 5 illustrating a header being mounted on the adjacent end of the cold plate.

In order to maintain a fluid tight seal between the headers 14 and 16 and the cold plate 12 in the embodiment shown in FIGS. 1–6, a central portion 34 of the cold plate 12 containing the fluid channels 18 and 20 projects beyond the adjacent end surface 36 of the outer portion of the cold plate and a gasket 38 is affixed to the end surface 36 as shown in FIGS. 5 and 6. In this embodiment, the end portion 34 of the cold plate has an enlarged ridge 40 with a ramp-shaped outer surface and the headers 14 and 16 have an internal ramped ridge 42 enabling the opposite sides of the header to be forced apart and snapped over the ridge 40 after engaging the gasket 38 so as to retain the seal in a compressed condition against the end surface 36 of the outer portion of the cold plate 12 as shown in FIG. 5. With this mounting arrangement no fasteners are required to attach the headers to the cold plate.

Figure 7:
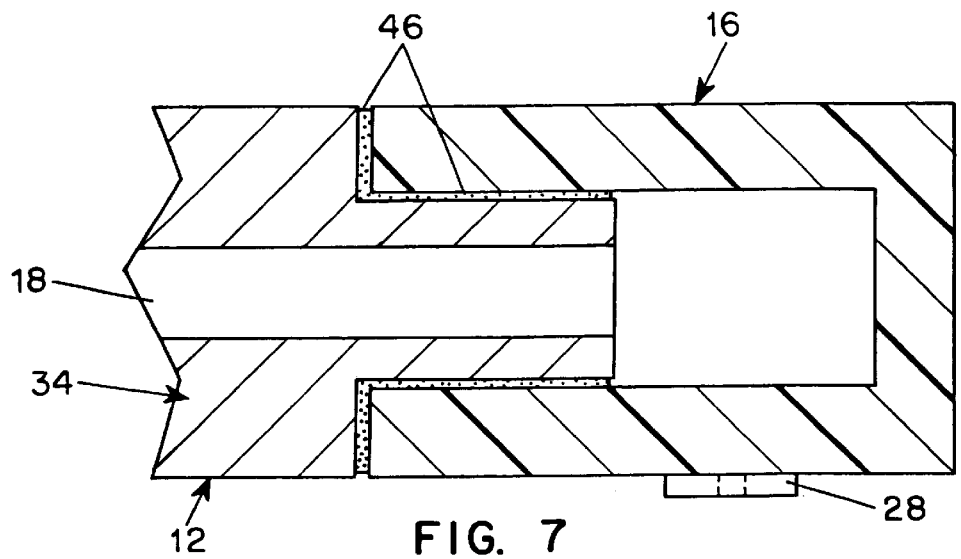
FIG. 7 is an enlarged fragmentary view similar to FIG. 6 illustrating an alternative embodiment of the invention.

In the embodiment shown in FIG. 7, the end portions 34 of the cold plate 12 and the inner surfaces of the headers have no ramp-like engaging portions but instead are held together by a layer of an adhesive sealing material 46 coated on the end surfaces 36 of the cold plate and the engaging surfaces of the header. This arrangement also eliminates the necessity for fasteners to attach the headers to the cold plate.

Figure 8:
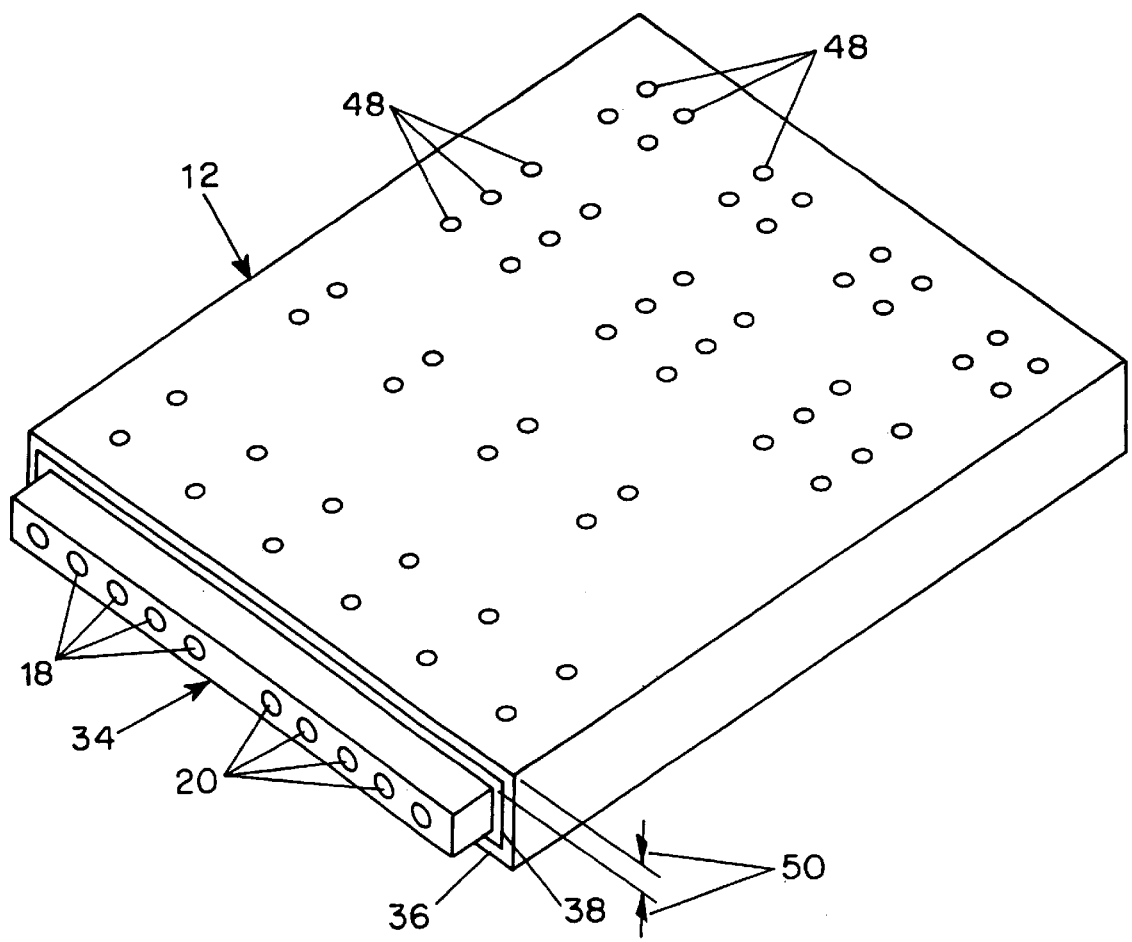
FIG. 8 is a perspective view of the cold plate shown in FIG. 1 illustrating the arrangement of mounting holes for electrical and electronic components on one surface of the cold plate.
Figure 9:
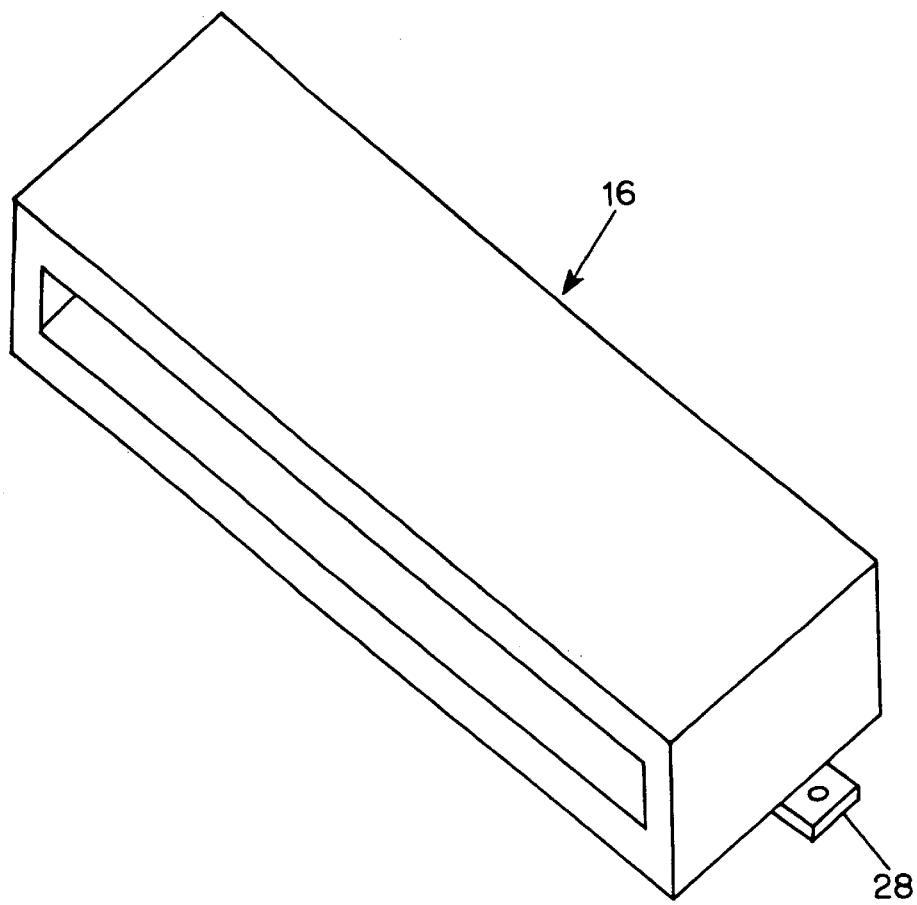
FIG. 9 is a perspective view illustrating the return header for the heat transfer cold plate arrangement shown in FIG. 1.

FIG. 8 illustrates a typical arrangement of mounting holes 48 for electrical and electronic components on the surface of the heat transfer cold plate 12. The maximum depth of the holes 48 is represented by the arrows 50 indicating the distance between the upper surface of the heat transfer cold plate 12 and the upper surface of the projection 34 containing the inlet passages 18 and outlet passages 20 to assure that the mounting holes do not intercept those passages.

Figure 10:
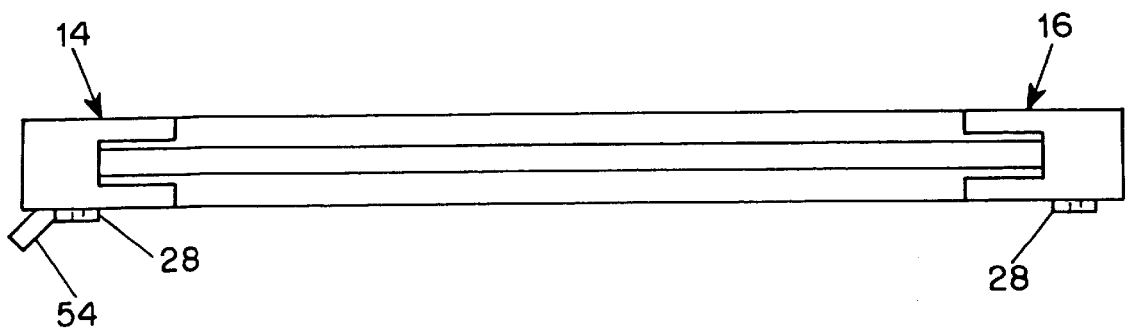
FIG. 10 is a side view showing another embodiment of a heat transfer cold plate arrangement according to the invention.

In the arrangement illustrated in FIG. 1, the inlet nozzle 22 and outlet nozzle 24 project perpendicularly from the end surface of the inlet/outlet header 14. If desired, in order to suit a particular application, the inlet and outlet nozzles may be angled from one side surface of the inlet/outlet header as indicated by the nozzle 54 shown in FIG. 10. Such angled inlet and outlet nozzles may extend either from the same side on opposite ends of the header and may be on the same surface on which the mounting feet 28 are located or on the opposite side surface.

In operation, heat-generating electrical or electronic components are mounted on one or both surfaces of the cold plate 12 using the threaded mounting holes 48 in such manner as to assure good heat transfer characteristics between the components and the cold plate. A coolant such as chilled water or other heat transfer fluid is supplied to the inlet nozzle 22 and flows through the inlet and return passages 18 and 20 at a rate sufficient to remove heat from the cold plate so as to maintain the component at or below a desired maximum temperature. Any heat transfer fluid providing the desired heat transfer characteristics and which does not react with or corrode the cold plate or the headers may be used. The circulation rate of the coolant may be controlled automatically, if desired, based on the detected temperature of the surface of the cold plate. Electrical isolation of the mounted electrical and electronic components from any structure on which the cold plate assembly is mounted is assured by the provision of the electrically insulating headers for the cold plate and the use of mounting feet which are attached to the electrically insulating headers.

Although the invention has been described herein with reference to specific embodiments, many modifications and variation therein would readily occur to those skilled in the art. Accordingly, all sorts of variations and modifications are included within the intended scope of the invention.

We claim:

1. A heat transfer cold plate arrangement comprising:
   a metallic cold plate provided with coolant passages for circulating a coolant;
   an inlet/outlet header made of electrically insulating material affixed to one end of the metallic cold plate to supply coolant through an inlet nozzle to a first set of coolant passages in the cold plate and to receive coolant from a second set of coolant passages in the cold plate for transfer to an outlet nozzle;
   a return header made of electrically insulating material affixed to an opposite end of the cold plate providing communication between the first and second set of coolant passages;
   the headers and the ends of the cold plate being joined by projections received in recesses; and
   mounting means on at least one of the headers whereby the cold plate is supported in an electrically insulating manner.

2. A heat transfer cold plate arrangement according to claim 1 wherein the cold plate has a projecting end portion of reduced width at each end which is received in and affixed to a recess in the corresponding header.

3. A heat transfer cold plate arrangement according to claim 2 including interengageable projections on the cold plate end portions and the headers permitting the headers to be snapped into place on the cold plate end portions.

4. A heat transfer cold plate arrangement according to claim 3 including a gasket disposed between each header and an adjacent end surface of the cold plate so that the gasket is compressed to form a seal when the corresponding header is mounted in place on the cold plate end portion.

5. A heat transfer cold plate arrangement according to claim 1 including a layer of adhesive between each header and an adjacent end surface of the cold plate to form an adhesive seal between the headers and the cold plate.

6. A heat transfer cold plate arrangement according to claim 1, wherein each header has two mounting feet disposed on the same side and at opposite ends of the header for supporting the assembled cold plate and headers in an electrically insulating manner.

7. A heat transfer cold plate arrangement according to claim 1 including an integral partition in the inlet/outlet header separating an inlet region from an outlet region.

8. A heat transfer cold plate arrangement according to claim 1 including a plurality of mounting holes in one side surface of the heat transfer cold plate having a depth which is less than the distance between that side surface and the coolant passages in the cold plate.

9. A heat transfer cold plate arrangement according to claim 1 wherein the inlet/outlet header has an inlet nozzle and an outlet nozzle each oriented in a plane extending parallel to the plane of the coolant passages in the cold plate.

10. A heat transfer cold plate arrangement according to claim 1 wherein the inlet/outlet header has inlet and outlet nozzles extending at an angle to a plane extending parallel to the coolant passages in the cold plate.

* * * * *